(12) United States Patent
Fauty et al.

(10) Patent No.: US 7,656,048 B2
(45) Date of Patent: Feb. 2, 2010

(54) ENCAPSULATED CHIP SCALE PACKAGE HAVING FLIP-CHIP ON LEAD FRAME STRUCTURE

(75) Inventors: Joseph K. Fauty, Mesa, AZ (US); James P. Letterman, Jr., Mesa, AZ (US); Denise Thienpont, Scottsdale, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 3 days.

(21) Appl. No.: 12/107,568

(22) Filed: Apr. 22, 2008

(65) Prior Publication Data
US 2008/0197459 A1    Aug. 21, 2008

(51) Int. Cl.
*H01L 23/28* (2006.01)
(52) U.S. Cl. ........................ 257/787; 257/778
(58) Field of Classification Search ................. 257/778, 257/787, 706, 707, 781, 780, 666, 676
See application file for complete search history.

(56) References Cited

U.S. PATENT DOCUMENTS

| | | | | |
|---|---|---|---|---|
| 3,886,585 A | * | 5/1975 | Konantz et al. | 257/766 |
| 4,000,842 A | * | 1/1977 | Burns | 228/180.21 |
| 5,134,460 A | * | 7/1992 | Brady et al. | 257/737 |
| 5,373,190 A | * | 12/1994 | Ichiyama | 257/737 |
| 5,554,887 A | * | 9/1996 | Sawai et al. | 257/737 |

* cited by examiner

*Primary Examiner*—S. V Clark
(74) *Attorney, Agent, or Firm*—Kevin B. Jackson

(57) ABSTRACT

In one embodiment, an encapsulated electronic package includes a semiconductor chip having patterned solderable pads formed on a major surface. During an assembly process, the patterned solderable pads are directly affixed to conductive leads. The assembly is encapsulated using, for example, a MAP over-molding process, and then placed through a separation process to provide individual chip scale packages having flip-chip on lead frame interconnects.

20 Claims, 8 Drawing Sheets

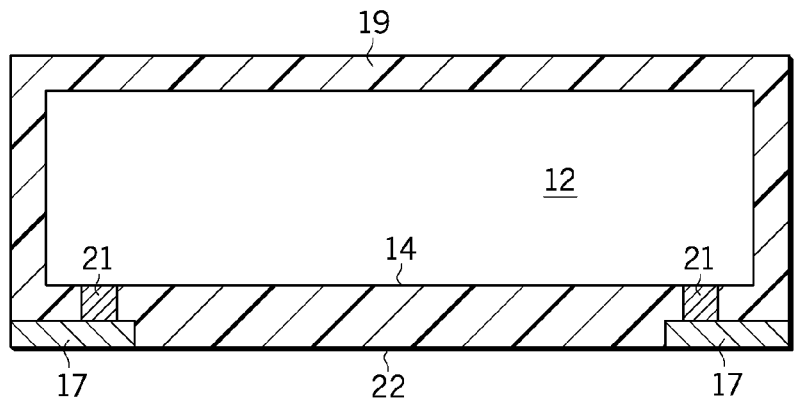
FIG. 1
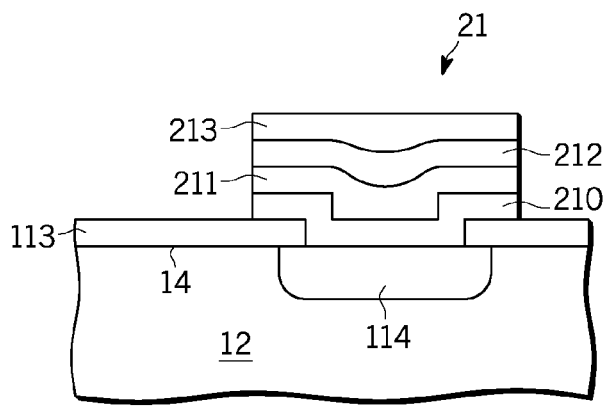
FIG. 2
FIG. 3
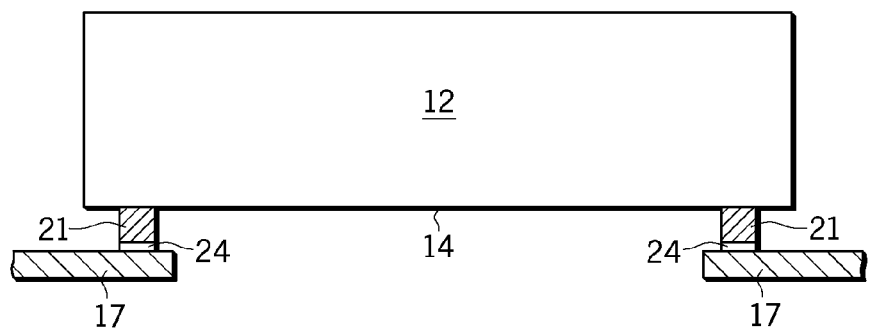

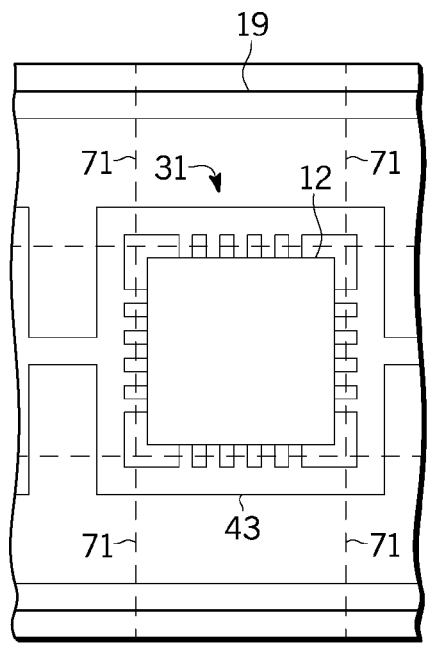
FIG. 7
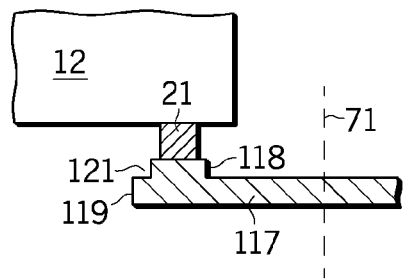   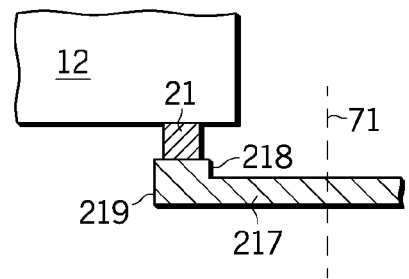
FIG. 8    FIG. 9
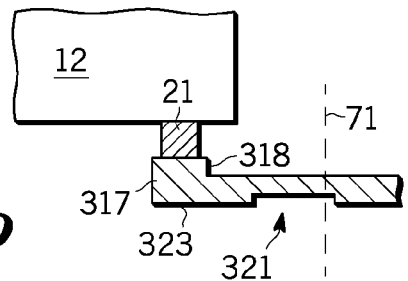
FIG. 10

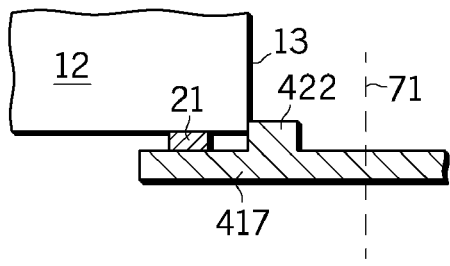
FIG. 11
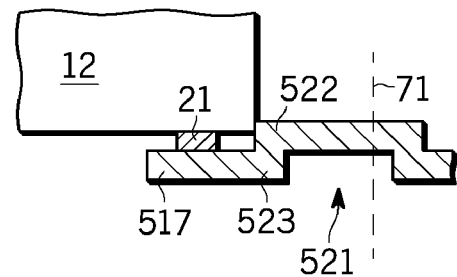
FIG. 12
FIG. 13
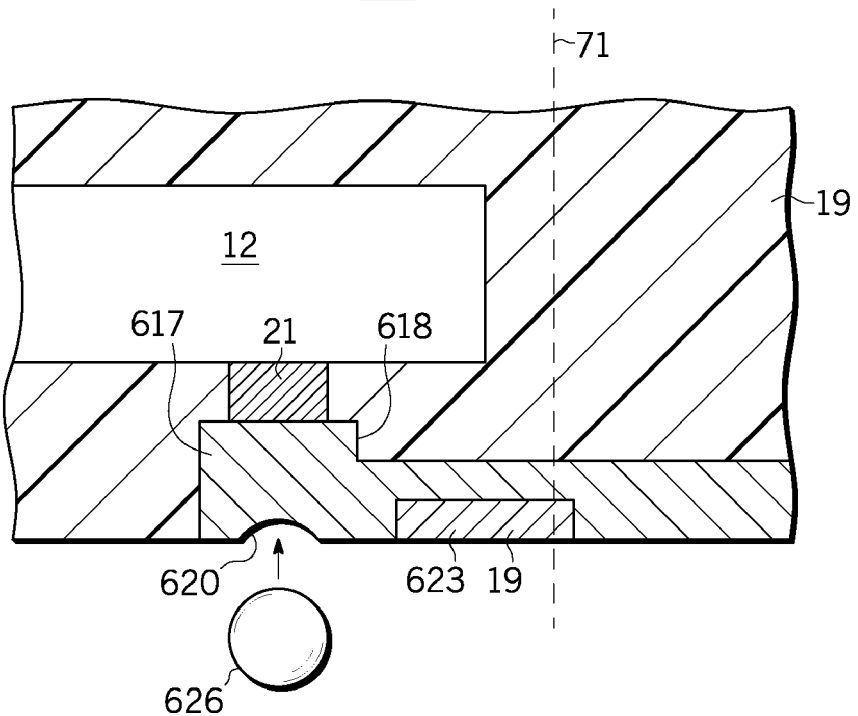

ENCAPSULATED CHIP SCALE PACKAGE HAVING FLIP-CHIP ON LEAD FRAME STRUCTURE

FIELD OF THE INVENTION

This invention relates generally to electronic devices, and more specifically to thin profile and small footprint packages and methods of assembly.

BACKGROUND OF THE INVENTION

The handheld consumer products market is aggressive in the miniaturization of portable electronics. Driven primarily by the cellular phone and digital assistant markets, manufacturers of these devices are challenged by ever shrinking formats and the demand for more PC-like functionality. This challenge asserts pressure on surface mount component manufacturers to design their products to command the smallest area possible. By doing so, this allows portable electronics designers to incorporate additional functions within a device without increasing the overall product size.

Manufacturers have developed various types of package and interconnect technologies to reduce the overall size of semiconductor components. Examples of packaging technologies include leadless packages, surface mount packages, chip-scale packages, and ball grid array packages. Examples of representative interconnection technologies include flip-chip interconnects, which includes solder ball, solder bump, and stud bump interconnect structures.

In a typical device using flip-chip interconnects, aluminum pads are formed overlying a semiconductor chip. A nitride passivation layer is then formed overlying the chip, and an organic passivation layer such as a benzocyclobutene (BCB1) layer is formed overlying the nitride passivation layer. Openings are then formed in the BCB1 and nitride layers to expose the aluminum pads. Next, under bump metal (UBM) pads such as an AlNiVCu pads are formed within the openings and contacting the underlying and exposed aluminum pads. Solder bumps or balls are then attached to the UBM pads using soldering, ball bonding, or stud bumping techniques.

Several problems exist with the flip-chip interconnect processes described above including process variability and reliability issues associated with the dissimilar materials. Also, the process flow is complicated by the ball attach or bump processes. Additionally, the conventional flip-chip interconnect process is very expensive with costs in the range of $90 to $150 per 200 mm wafer.

Accordingly, a need exists for an improved electronic package structure and method that has a small size, that is cost effective, and that addresses the reliability problems associated with solder ball/bump interconnect schemes described above.

BRIEF DESCRIPTION OF THE DRAWINGS

FIG. 1 illustrates a cross-sectional view of a packaged device in accordance with an embodiment of the present invention;

FIG. 2 illustrates an enlarged cross-sectional view of an interconnect structure in accordance with the present invention;

FIG. 3 illustrates a highly enlarged cross-sectional view of a portion of the packaged device of FIG. 1 at an intermediate stage of manufacture;

FIG. 7 illustrates a top view of the packaged device of FIG. 1 processed in accordance with the present invention prior to separation;

FIGS. 8-12 illustrate partial side views of conductive lead structures in accordance with various embodiments of the present invention;

FIG. 13 illustrates a partial cross-sectional view of a packaged device in accordance with another embodiment of the present invention;

DETAILED DESCRIPTION OF THE DRAWINGS

Figure 4:
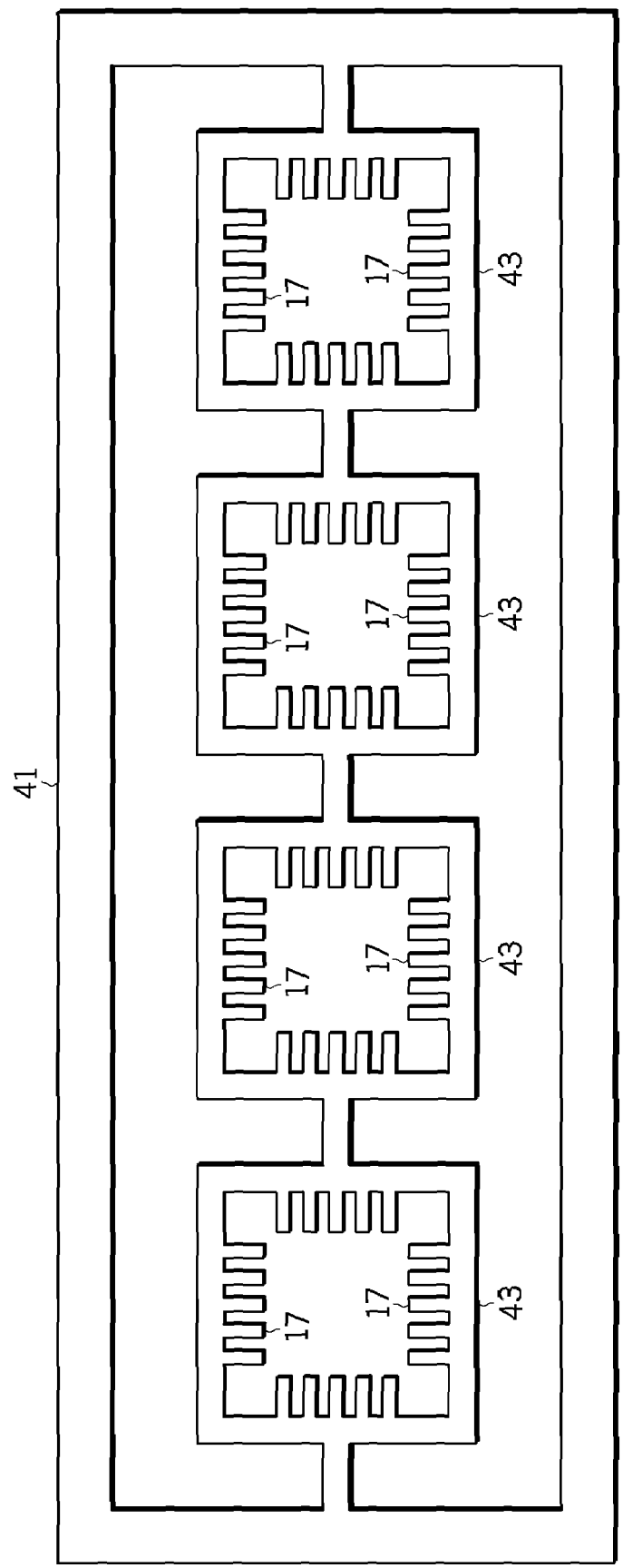
FIG. 4 illustrates a top view of an embodiment of a main lead frame structure for use with the present invention.

For ease of understanding, elements in the drawing figures are not necessarily drawn to scale, and like element numbers are used where appropriate throughout the various figures to denote the same or similar elements. Additionally, the present invention is described below using a quad flat no-lead (QFN) chip-scale package embodiment. It is understood that the present invention is suitable for other chip-scale package types as well.

FIG. 1 shows a highly enlarged cross-sectional view of a packaged semiconductor or electronic device or structure 10 in accordance with an embodiment of the present invention. In accordance with the present invention, device 10 comprises an encapsulated chip-scale package having a flip-chip on lead frame interconnect structure. As used herein, a chip scale package typically refers to a package that is less than approximately 1.2 times the size of the electronic component contained within the package.

Device 10 includes a semiconductor chip or device 12 having a major surface 14. By way of example, semiconductor chip 12 comprises a logic, power, memory, sensor, optical, or passive component, and is shown in the flip-chip on lead frame configuration described above. In the embodiment shown, device 10 is suitable for those devices having requirements for interconnect schemes on one surface only. An alternative embodiment having requirements for interconnect schemes on multiple surfaces will be described below in conjunction with FIG. 14.

Device 10 further includes a plurality of conductive leads or solderable leads 17 that provide electrical connection to a next level of assembly or structures external to chip 12. Conductive leads 17 may have a variety of shapes and features, which will be more fully described below in conjunction with FIGS. 8-13. By way of example, conductive leads 17 comprise a solderable material such as a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, or multi-layer plating such nickel-palladium and gold.

An encapsulating or covering layer 19 encloses chip 12 and portions of conductive leads 17 while leaving other portions of conductive leads 17 exposed along a major surface 22 of device 10 as shown, for example, in FIG. 1. By way of example, encapsulating layer 19 comprises a plastic epoxy resin material.

In accordance with the present invention, solderable metal pads, multi-layer solderable conductive structures, patterned solderable interconnect structures, or patterned solderable metal pads 21 are formed or patterned overlying major surface 14 to interconnect circuitry formed on, over, or within chip 12 to conductive leads 17. In accordance with the present invention, solderable pads 21 include a patterned solderable metal layer or coating positioned or placed as an outermost or exposed layer for connecting or attaching to conductive leads 17 of device 10. As used herein, a solderable metal is defined as a metal having good to excellent solderability, or a metal having a surface that is wetted relatively easily by molten solder. Examples of solderable metals include copper, silver, gold, palladium, rhodium, nickel-silver, and the like. Examples of metals that are not considered solderable include chromium, titanium, aluminum, and aluminum alloys.

Additionally, as used herein, a patterned structure refers to a structure resulting from the deposition or formation of one or more blanket layers overlying a semiconductor chip or wafer, which are subsequently etched or patterned to form specific structures according to a predefined pattern or mask. As used herein, patterned structure does not include a structure formed by electroplating techniques.

FIG. 2 shows a partial highly enlarged view of a portion of chip 12 to provide additional detail of one patterned solderable pad or patterned interconnect structure 21 in accordance with the present invention. In this example, pad 21 comprises a structure of multiple layers of conductive material formed overlying chip 12, which is shown with a dielectric layer 113. For example, pad 21 includes a first conductive layer 210 of aluminum or an aluminum alloy such as AlCu, AlCuSi, AlSi, or the like formed overlying chip 12, and contacting for example, a device structure or region 114 formed within or on chip 12. By way of example, first layer 210 has a thickness in a range from about 0.5 microns to about 5.0 microns. An adhesion or second conductive layer 211 is then formed over first conductive layer 210 and comprises, for example, titanium, chromium, titanium nitride, or the like. By way of example, second conductive layer 211 has a thickness in a range from about 0.1 microns to about 0.2 microns. A diffusion barrier layer or third conductive layer 212 is then formed over second conductive layer 211 and comprises for example nickel, nickel vanadium, or the like. By way of example, third conductive layer 212 has a thickness in a range from about 0.15 microns to about 0.3 microns. A solderable metal layer or fourth conductive layer 213 is formed over third conductive layer 212, and comprises for example, copper, silver, gold, or the like. By way of example, fourth conductive layer has a thickness in a range from about 0.7 microns to about 1.0 microns.

In accordance with the present invention, patterned solderable pads 21 are formed overlying chip 12 using conventional evaporation or sputter deposition techniques, and are subsequently patterned using conventional lithography and etch techniques. Patterned solderable pads 21 have a thickness suitable for providing sufficient space between chip 12 and leads 17. Patterned solderable pads 21 avoid the assembly and reliability problems associated with prior art flip-chip interconnect schemes that utilize dissimilar materials including UBM layers, organic passivation layers, and attached solder balls or bumps. Additionally, the present invention reduces interconnect processing costs by approximately 80% due to simplified processing.

FIG. 3 shows a highly enlarged cross-sectional view of a portion of device 10 shown in FIG. 1 at an intermediate stage of manufacture. At this step, semiconductor chip 12 having patterned pads 21 is provided along with a lead frame having conductive leads 17. An attach or solder attach layer 24 is used to join or affix patterned pads 21 to conductive leads 17 to provide a flip-chip to lead frame structure or assembly 31. By way of example, attach layer 24 comprises a solder perform or paste. For example, attach layer 24 comprises a eutectic solder, a bonding solder paste, a solder pre-form film, or the like. In one embodiment, attach layer 24 comprises a lead/tin/silver or a lead-free solder material.

In one process sequence, chip 12, attach layers 24 and conductive leads are placed in contact to form assembly 31. Assembly 31 is then heated using, for example, a reflow furnace or the like to form a metallic bond between patterned pads 21 and conductive leads 17. In an alternative process flow, conductive leads 17 are pre-heated, attach layer 24 is placed on conductive leads 17, and chip 12 is affixed or soldered to conductive leads 17 in a one step process. Alternatively, attach layers 24 are placed on pads 21 and then placed onto pre-heated conductive leads 17.

FIG. 4 is a top view of a main lead frame 41 suitable for use as a component of the present invention. Main lead frame 41 comprises a plurality of sub lead frames 43, which include a plurality of conductive leads 17. Although only four sub lead frames 43 are shown, more or less may be used including an array having multiple rows and columns.

Figure 5:
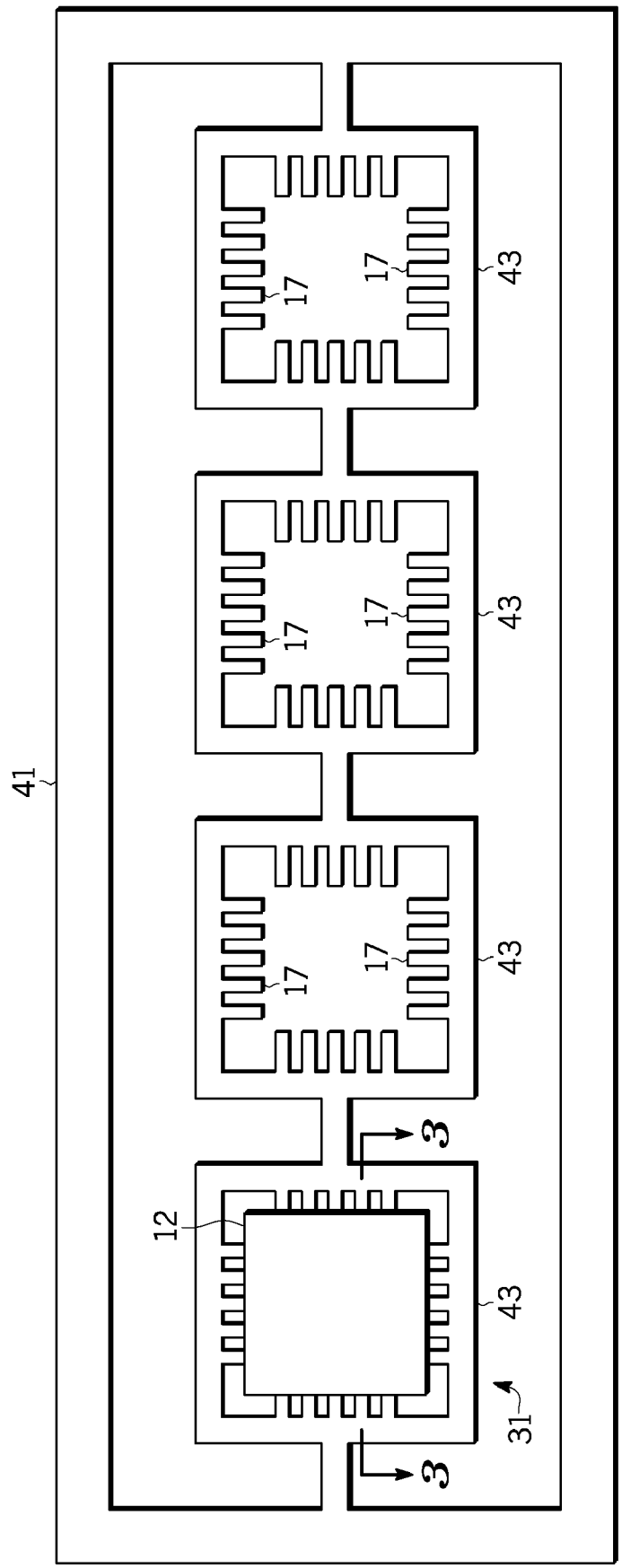
FIG. 5 illustrates a top view of the main lead frame structure of FIG. 4 after further processing in accordance with the present invention.

FIG. 5 shows a top view of main lead frame 41 having a first semiconductor chip 12 attached to one of sub lead frames 43 to provide one of assemblies 31. For ease of understanding, the cross-sectional view of flip-chip on lead frame assembly 31 shown in FIG. 3 is taken along reference line 3-3 of FIG. 5. Additional chips 12 are then attached to available or remaining sub lead frames 43 using, for example, the processes outlined above in conjunction with FIG. 3 to provide a plurality of flip-chip on lead frame assemblies 310.

Figure 6:
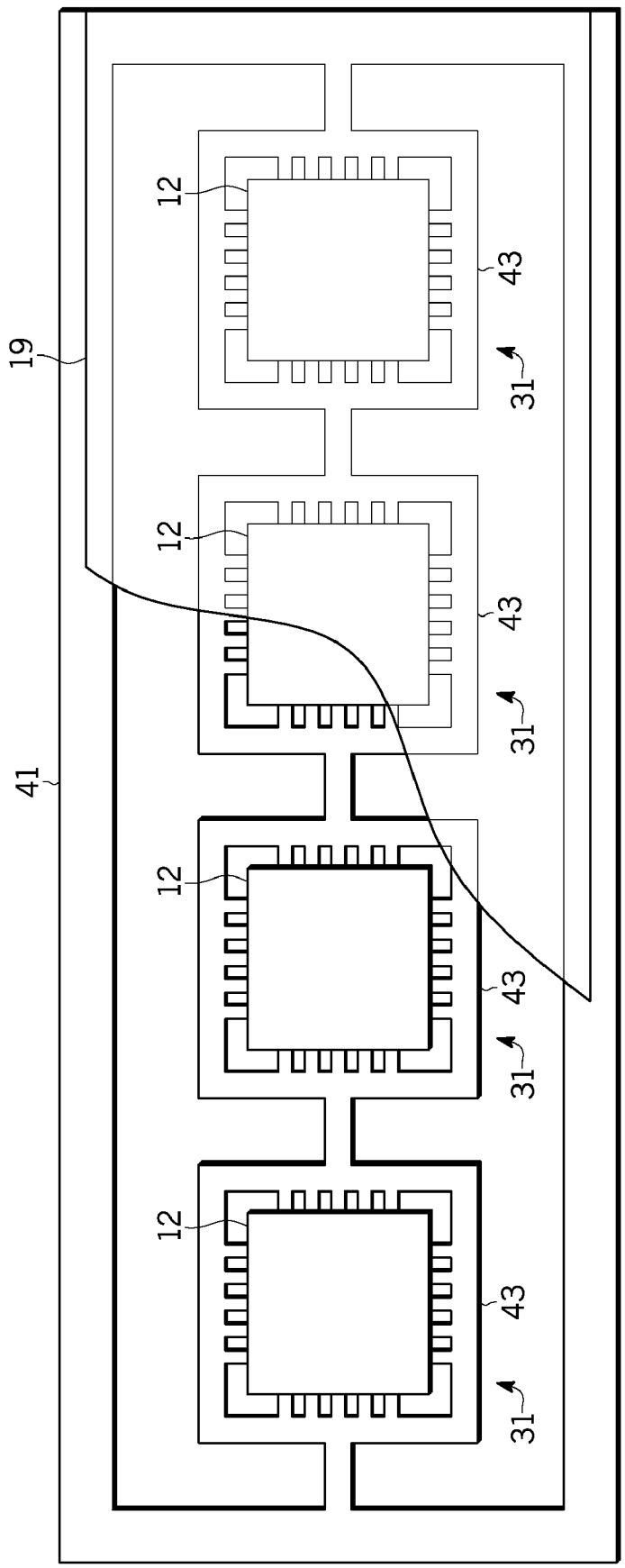
FIG. 6 illustrates a top view of the main lead frame structure of FIG. 4 after still further processing in accordance with the present invention.

FIG. 6 shows a top view of the structure of FIG. 5 after encapsulating layer 19 is formed over main lead frame 41. The embodiment shown in FIG. 6 comprises a molded array package (MAP) assembly, where encapsulating layer 19 covers sub lead frames 43 as a continuous film. Alternatively, encapsulating layer 19 is formed using cavity molding, liquid encapsulating, or slot molding techniques.

After encapsulating layer 19 is formed, a singulation process is used to separate the array of devices into individual packages or devices 10 as shown in FIG. 7. Lines 71 represent an example of separation lines where a saw cut or other separation or singulation means occurs.

Turning now to FIGS. 8-12, various embodiments of conductive leads 17 are described in accordance with the present invention. Dashed line 71 represents a suggested singulation line throughout the various embodiments. Encapsulating layer 19 is not shown for ease of understanding this portion of the present invention. FIG. 8 shows a partial side view of a conductive lead 117 that includes a raised or step portion 118 for receiving a patterned solderable pad 21 of chip 12. One advantage of raised portion 118 is that it provides for better alignment of chip 12 during the attachment process, which helps prevent chip 12 from inadvertently rotating during assembly. In the embodiment shown, raised portion 118 is spaced apart from end portion 119 leaving a recessed portion 121 between end portion 119 and raised portion 118. In a final assembly, the exposed portion or the outer surface of conductive lead 117 extends to the edge of device 10 as shown in FIG. 1.

FIG. 9 shows a partial side view of a conductive lead 217 having a raised or step portion 218. Conductive lead 217 is similar to conductive lead 117 except that raised portion 218 abuts or is adjacent to end portion 219. In a final assembly, the exposed portion or the outer surface of conductive lead 217 extends to the edge of device 10 as shown in FIG. 1.

FIG. 10 shows a partial side view of a conductive lead 317 having a raised portion 318 and a recessed portion 321. Conductive lead 317 is similar to conductive lead 217 except that after encapsulation, recessed portion 321 is filled with encapsulating material so that an exposed portion or outer surface 323 of conductive lead 317 is inset from the edge of the encapsulated device, and separated from the edge of the device by encapsulating material. An example such a structure is shown in FIG. 13 described below.

FIG. 11 shows a partial side view of a conductive lead 417 having an alignment feature or raised portion 422 that abuts or is adjacent to an edge 13 of semiconductor chip 12, which provides for a more consistent alignment or placement of semiconductor chip 12 during the assembly process.

FIG. 12 shows a partial side view of a conductive lead 517 having an alignment feature or raised portion 522, which is similar to alignment feature 422. Conductive lead 571 further has a recessed portion 521, which fills with encapsulating material during the encapsulating process. This leaves exposed portion or outer surface 523 of conductive lead 517 inset from the edge of the encapsulated device, and separated from the edge of the device by encapsulating material. An example of such a structure is shown in FIG. 13 described below.

FIG. 13 shows a partial cross-sectional view of a packaged semiconductor or electronic device or structure 100 in accordance with another embodiment of the present invention. In accordance with the present invention, device 100 comprises an encapsulated chip-scale package having a flip-chip on lead frame interconnect structure. Device 100 is similar to device 10 except that device 100 further includes solder balls or bumps 626 connected to conductive leads 617 to provide a ball grid array embodiment. In one embodiment, conductive lead 617 includes a pocket, dimple, or indentation 620 for receiving one of solder balls 626. In optional embodiments, conductive lead 617 further includes a raised portion 618 and/or a recessed portion 623. Additionally, it is understood that the one or more of the various features disclosed herein including those shown in FIGS. 8-12 may be incorporated into devices 10 and 100.

Figure 14:
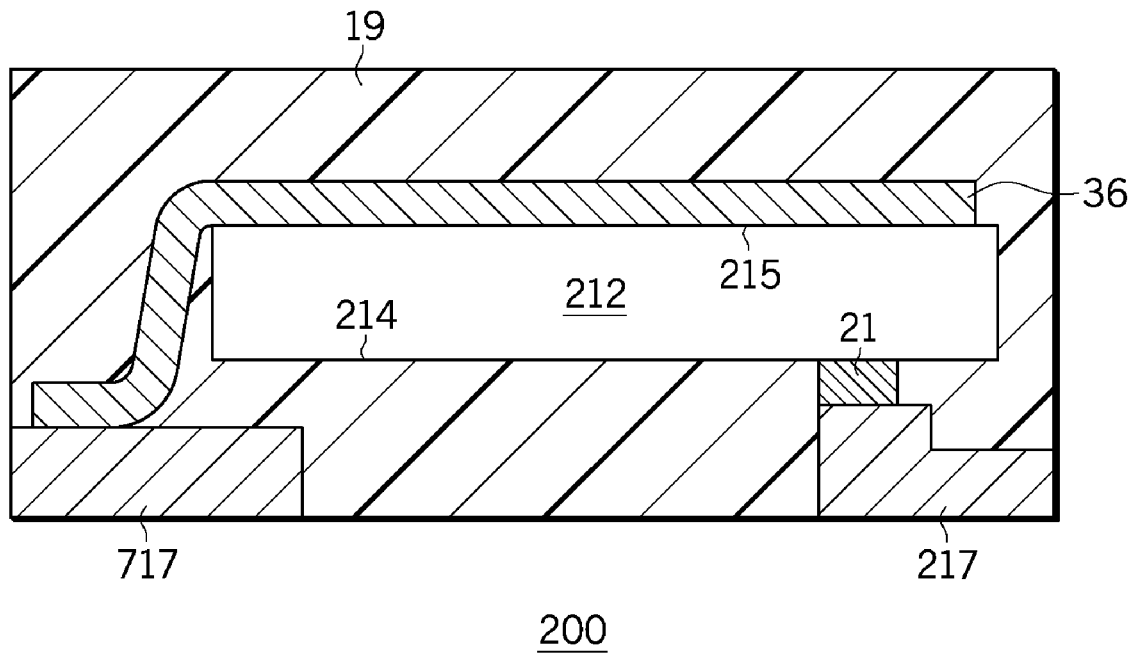
FIG. 14 illustrates a cross-sectional view of a packaged device in accordance with a further embodiment of the present invention.

FIG. 14 shows a highly enlarged cross-sectional view of a packaged semiconductor or electronic device or structure 200 in accordance with a further embodiment of the present invention. In accordance with the present invention, device 200 comprises an encapsulated chip-scale package having a flip-chip on lead frame interconnect structure. Device 200 includes a chip 212 that is similar to chip 12 except that chip 212 does not have a pad 21 over a conductive lead 717, and chip 212 includes an active or second major surface 215 for passing a current of the device. Chip 212 is attached to conductive lead 217 using a pad 21 formed overlying major surface 214 of chip 212. Structure 200 further includes an attachment device 36 that connects or couples active surface 215 to conductive lead 717. By way example, attachment device 36 comprises a conductive clip such as a metal clip, a metal plated metal clip, or a metal plated plastic clip. Additionally, it is understood that one or more of the various features disclosed herein including those shown in FIGS. 8-13 may be incorporated into device 200.

Figure 15:
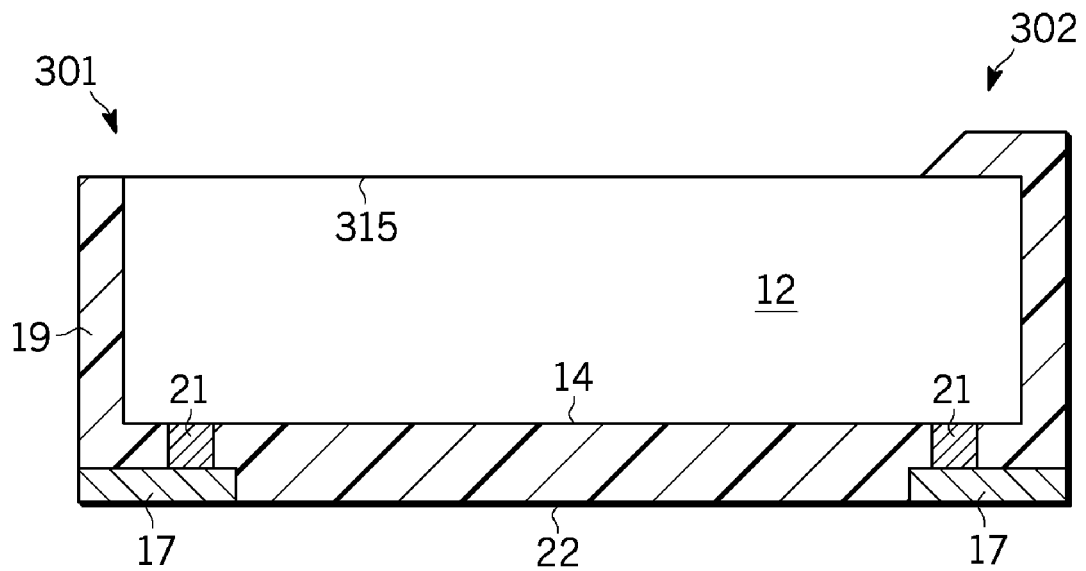
FIG. 15 illustrates a cross-sectional view of a packaged device in accordance with a still further embodiment of the present invention.

FIG. 15 shows a highly enlarged cross-sectional view of a packaged semiconductor or electronic device or structure 300 in accordance with a still further embodiment of the present invention. In accordance with the present invention, device 300 comprises an encapsulated chip-scale package having a flip-chip on lead frame interconnect structure. Device 300 is similar to device 10 except that encapsulation material 19 does not fully cover or encapsulate major surface 315 of device 12. In other words, all or portion of surface 315 is exposed. This provides, for example, an embodiment for making direct contact to surface 315 of chip 12 for electrical or heat transfer purposes. By way of example, a clip (e.g., clip 36 shown in FIG. 14) or wire bond is attached to surface 215 for connecting device 12 to another assembly structure. Alternatively, a head spreading device is attached (directly or indirectly) to surface 315 to enhance thermal performance of device 300. Representative embodiments 301 and 302 are shown as examples of structures with exposed surfaces 315. In embodiment 301, encapsulating layer 19 is substantially flush with surface 315 and is formed using a blanket masking structure during molding, or is formed using a grinding or other removal technique after encapsulation. In embodiment 302, a portion of encapsulating layer 19 is formed overlying surface 315 to provide a window frame like structure. Embodiment 302 is formed using masking techniques during molding or using etching or other removal techniques after encapsulation. Additionally, it is understood that one or more of the various features disclosed herein including those shown in FIGS. 8-14 may be incorporated into device 300.

Figure 16:
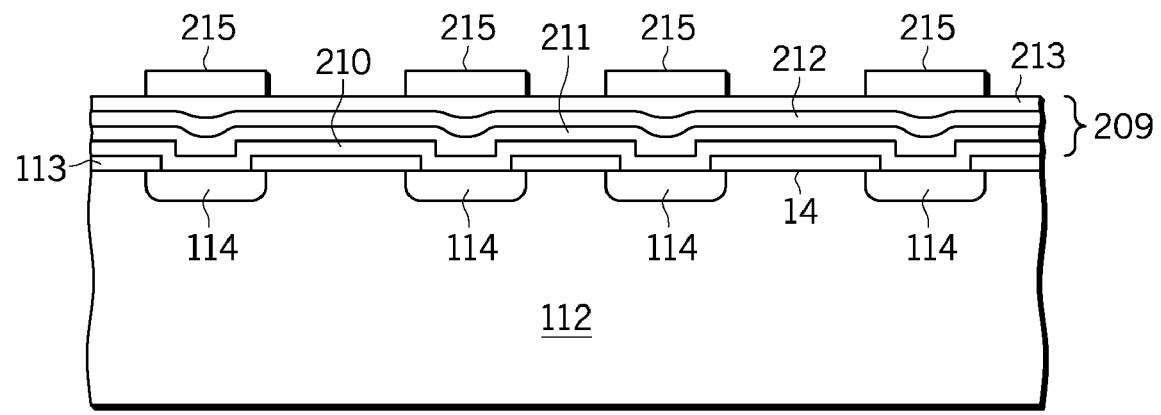
FIGS. 16 and 17 illustrate enlarged cross-sectional views of a portion of a substrate at various stages of manufacture showing the formation of an interconnect structure in accordance with the present invention.
Figure 17:
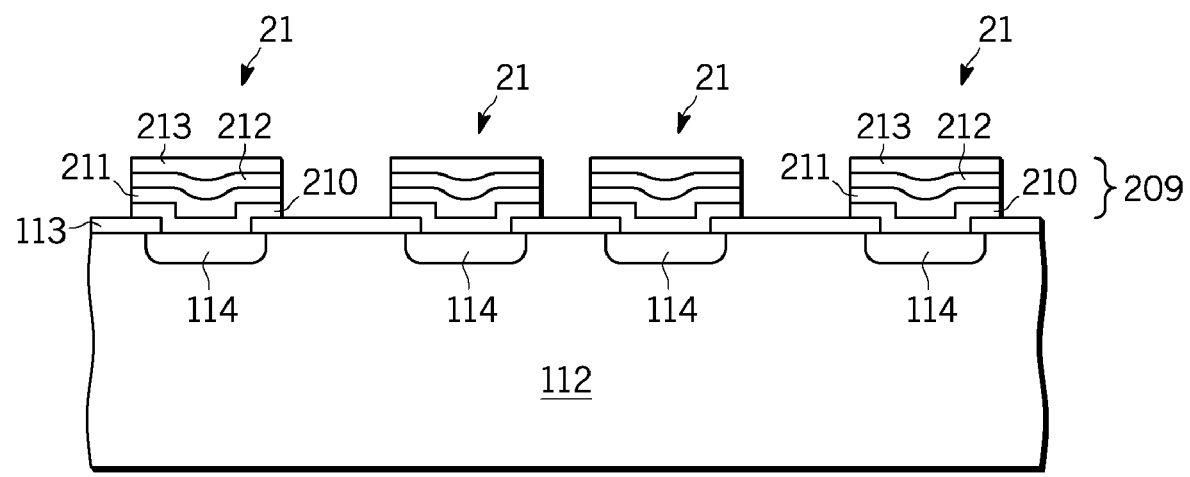

FIGS. 16 and 17 show enlarged partial cross-sectional views of a substrate or semiconductor wafer 112 at various stages of manufacture to illustrate a wafer level method for forming patterned pads 21 in accordance with the present invention. In FIG. 16 wafer 112 is shown with dielectric layer 113 having openings to provide access to device regions 114 formed at various places along major surface 14. A plurality of blanket conductive layers 209 are deposited overlying wafer 112 using evaporation or sputter deposition techniques. In the embodiment shown, plurality of layers 209 comprises conductive layers 210-213 described in conjunction with FIG. 2. It is understood that plurality of layers 209 may comprise more or less conductive layers, and that the layers are deposited sequentially in a single deposition, in separate deposition steps, or combinations thereof. In accordance with the present invention, plurality of layers 209 includes as an outermost conductive layer a solderable metal layer 213.

A photo resist layer is then deposited overlying layers 209 and patterned using conventional lithography techniques to provide a predetermined or desired pattern 215. Next, the exposed portions of layers 209 are etched, and the patterned resist layer 215 is removed to provide patterned conductive pads or structures 21 shown in FIG. 17. It is understood that a portion of layers 209 may be deposited and patterned, and additional layers 209 deposited and patterned subsequently to provide patterned conductive pads 21. Wafer 112 is then separated into a plurality of chips or devices 12 using well known techniques.

Thus, it is apparent that there has been provided, in accordance with the present invention, a structure and method for forming an improved electronic package. The package incorporates an electronic chip having a patterned connective structure or pad formed on a major surface. The patterned connective structure includes an exposed or outer solderable metal layer for forming a metallurgical bond to a conductive lead to provide a flip-chip on lead frame structure. The patterned connective structure provides a more reliable and cost effective package structure compared to prior art devices.

In further embodiments, solder balls or bumps are added to the conductive leads, and a conductive clip is incorporated to connect a major surface of the electronic chip to a conductive lead.

Although the invention has been described and illustrated with reference to specific embodiments thereof, it is not intended that the invention be limited to these illustrative embodiments.

What is claimed is:

1. A semiconductor package comprising:
a plurality of conductive leads;
an electronic device having a plurality of patterned pads formed overlying a first major surface of the electronic device, wherein each of the plurality of patterned pads includes an solderable metal layer as an outermost layer, and wherein the plurality of patterned pads are solder attached directly to the plurality of conductive leads without an intervening solder ball, solder bump, or stud bump, wherein the plurality of conductive leads includes conductive leads with recessed portions; and
an encapsulating layer covering the electronic device and portions of the conductive leads, wherein other portions of the plurality of conductive leads are exposed along a major surface of the semiconductor package, and wherein the recessed portions are filled with the encapsulating layer so that exposed portions of the conductive leads are inset from edges of the semiconductor package.

2. The package of claim 1 wherein the plurality of conductive leads includes conductive leads with raised portions for aligning the electronic device to the conductive leads.

3. The package of claim 1 wherein the solderable metal layer comprises one of copper, silver, and gold.

4. The package of claim 1 further comprising a conductive structure attached to a second major surface of the electronic device and a conductive lead.

5. A semiconductor package comprising:
a semiconductor chip having a plurality of patterned solderable structures formed on a first major surface of the semiconductor chip;
a plurality of conductive leads, wherein the patterned solderable structures are attached to conductive leads without an intervening solder ball, solder bump, or stud bump, wherein the patterned solderable structures are configured to physically separate the semiconductor chip from the conductive leads, and wherein an edge of the semiconductor chip is attached adjacent to raised portions formed on the plurality of conductive leads without overlapping the raised portions; and
an encapsulating material covering the semiconductor chip and at least portions of the plurality of conductive leads.

6. The package of claim 5, wherein the plurality of conductive leads have exposed portions inset from an edge of the package.

7. The package of claim 5 further comprising a conductive clip attached to a second major surface of the semiconductor chip and at least one conductive lead.

8. The package of claim 5 further comprising one of solder bumps and solder balls attached to pockets formed in outer surfaces of the plurality of conductive leads.

9. The package of claim 5, wherein a second major surface of the semiconductor chip is exposed through the encapsulating material, and wherein the second major surface is opposite the first major surface.

10. The package of claim 5, wherein the plurality of conductive leads have exposed portions inset from an edge of the package.

11. The package of claim 5, wherein the plurality of conductive leads have raised portions, and wherein the patterned solderable structures are attached to the raised portions, and wherein the plurality of conductive leads have end portions in proximity to the semiconductor chip, and wherein the raised portions are spaced apart from the end portions leaving recessed portions there between.

12. The package of claim 5, wherein the plurality of conductive leads have raised portions, and wherein the patterned solderable structures are attached to the raised portions, and wherein the plurality of conductive leads have recessed portions that leave exposed portions of the plurality of conductive leads inset from an edge of the package.

13. A semiconductor package comprising:
a plurality of conductive leads, wherein the plurality of conductive leads include raised portions that project away from surfaces of the plurality of conductive leads;
an electronic device having a plurality of solderable patterned pads formed on first major surface, wherein the plurality of solderable patterned pads are solder attached to the conductive leads without an intervening solder ball, solder bump, or stud bump, and wherein the plurality of solderable patterned pads physically separate the electronic device from the lead frame, and wherein the solderable patterned pads are attached to the plurality of conductive leads so that an edge of the electronic device is adjacent the raised portions without overlapping the raised portions; and
an encapsulating material overlying the electronic device and at least portions of the plurality of conductive leads.

14. The package of claim 13, wherein at least one solderable patterned pad comprises:
a first layer including aluminum formed overlying at least a portion of the electronic device;
a second layer including one of titanium, chromium, and titanium nitride formed overlying the first layer;
a third layer including nickel formed overlying the second layer; and
a fourth layer including one of copper, gold and silver formed overlying the third layer.

15. The package of claim 13, wherein the plurality of conductive leads include recessed portions that leave exposed portions of the plurality of conductive leads inset from edges of the package.

16. The package of claim 13, wherein the plurality of conductive leads include indentations, and wherein the package further includes one of solder bumps and solder balls attached to the indentations.

17. The package of claim 13, further comprising an attachment device coupled to a second major surface of the electronic device and to at least one conductive lead.

18. A semiconductor package comprising:
a plurality of conductive leads;
an electronic device having a plurality of solderable patterned pads formed on first major surface, wherein the plurality of solderable patterned pads are solder attached to the conductive leads without an intervening solder ball, solder bump, or stud bump, and wherein the plurality of solderable patterned pads physically separate the electronic device from the lead frame, and wherein at least one solderable patterned pad comprises:
a first layer including aluminum formed overlying at least a portion of the electronic device;

a second layer including one of titanium, chromium, and titanium nitride formed overlying the first layer;

a third layer including nickel formed overlying the second layer; and a fourth layer including one of copper, gold and silver formed overlying the third layer; and an encapsulating material overlying the electronic device and at least portions of the plurality of conductive leads.

19. The package of claim 18, further comprising an attachment device coupled to a second major surface of the electronic device and to at least one conductive lead.

20. The package of claim 18, wherein the plurality of conductive leads include recessed portions that leave exposed portions of the plurality of conductive leads inset from edges of the package.

* * * * *

UNITED STATES PATENT AND TRADEMARK OFFICE
CERTIFICATE OF CORRECTION

Page 1 of 1

PATENT NO. : 7,656,048 B2
APPLICATION NO. : 12/107568
DATED : February 2, 2010
INVENTOR(S) : Fauty et al.

It is certified that error appears in the above-identified patent and that said Letters Patent is hereby corrected as shown below:

On the Title page of the patent please insert:
Item --(62)   Related U.S. Application Data
Division of Application No. 11/205,464 filed on Aug. 18, 2005, now Patent No. 7,439,100.--

At Column 1, line 3 - please insert the following text:
--The present application is based on prior US application No. 11/205464, filed on Aug. 18, 2005, which is hereby incorporated by reference, and priority thereto for common subject matter is hereby claimed.--

Signed and Sealed this
Twenty-fourth Day of May, 2011

David J. Kappos
*Director of the United States Patent and Trademark Office*